United States Patent [19]
Whitman
[11] 3,848,077
[45] Nov. 12, 1974

[54] PACKAGE FOR ELECTRONIC SEMICONDUCTOR DEVICES

[76] Inventor: Marcus E. Whitman, 482 Cheyenne Ln, San Jose, Calif. 95123

[22] Filed: Oct. 16, 1970
[21] Appl. No.: 81,310

[52] U.S. Cl. ............ 174/52 S, 29/627, 174/DIG. 3, 357/74
[51] Int. Cl. ............ H05k 5/00
[58] Field of Search............ 174/DIG. 3, 525, 50.51, 174/50.61; 317/101 A, 101 CP, 234 G; 29/626, 627

[56] References Cited

UNITED STATES PATENTS

| | | | |
|---|---|---|---|
| 3,312,771 | 4/1967 | Hessinger et al. | 174/DIG. 3 UX |
| 3,558,993 | 1/1971 | Rigby | 317/101 CP |

*Primary Examiner*—Darrell L. Clay
*Attorney, Agent, or Firm*—Jack M. Wiseman

[57] ABSTRACT

A ceramic package for electronic semiconductor devices comprising a bottom layer, an intermediate layer and a top layer. The bottom layer is formed with a plurality of holes disposed adjacent the outer wall thereof. Seated centrally on the bottom layer is a conventional semiconductor device. The holes of the bottom layer are filled with a suitable conductor metal for establishing electrical connections between the package and an electrical circuit to be connected thereto. The intermediate layer is formed with holes aligned with and in registration with the holes of the bottom layer. The holes of the intermediate layer are filled with a suitable conductor metal for establishing electrical connections with the metal filled holes, respectively, of the bottom layer. A cavity is formed centrally in the intermediate layer for receiving the semiconductor device. Conductor metallic tabs project laterally from the metal filled holes, respectively, of the intermediate layer to establish electrical connections between the metal filled holes of the intermediate layer and the terminal leads. The terminal leads, in turn, are connected to the terminals on the semiconductor device. The top layer is formed with a cavity greater in dimension than the cavity formed in the intermediate layer, whereby a shoulder or ledge is formed for the seating of the electrical connection tabs thereon. A suitable cover is sealed on the top layer to form an encapsulated, hermetically sealed package for the semiconductor device.

3 Claims, 8 Drawing Figures

FIG. 1
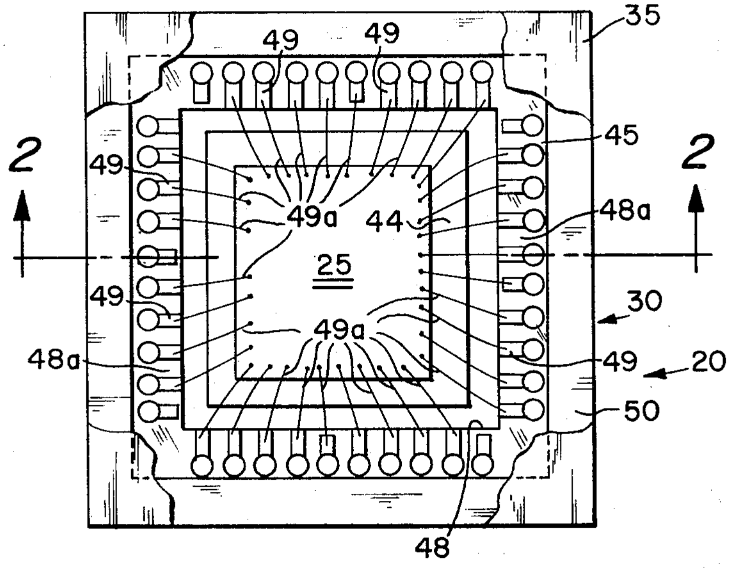
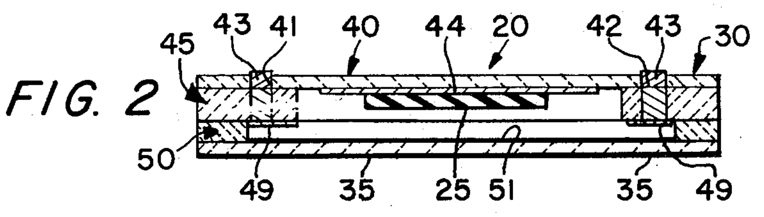
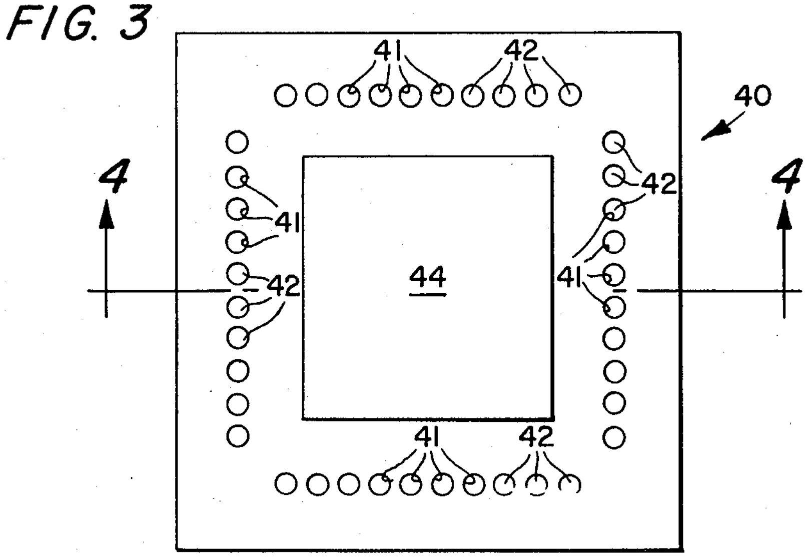
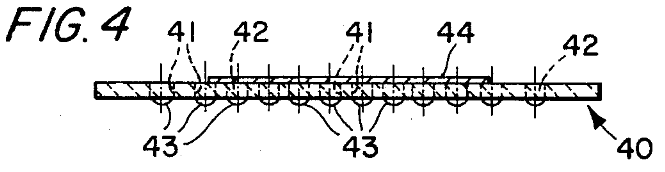
INVENTOR.
MARCUS E. WHITMAN
BY Jack M. Weisman
ATTORNEY INVENTOR.
MARCUS E. WHITMAN
BY Jack M. Wiseman
ATTORNEY

PACKAGE FOR ELECTRONIC SEMICONDUCTOR DEVICES

BACKGROUND OF THE INVENTION

The present invention relates in general to packages for electronic semiconductor devices, and more particularly to a ceramic package for an electronic semiconductor device.

Heretofore, semiconductor or microelectronic circuit manufacturers were confronted with problems in the areas of size, cost, package outline, and feasibility. Also, quality control tests were performed after the cover was hermetically sealed to the package and the semiconductor device was encapsulated. This procedure rendered the replacement of defective parts impossible and as a consequence thereof the entire package was rejected without any opportunity to merely replace the defective component.

SUMMARY OF THE INVENTION

A ceramic package for a semiconductor device in which vertically aligned metal filled holes establish electrical connections for a semiconductor device in the package.

A ceramic package for a semiconductor device comprising layers defining vertically aligned holes filled with metal to establish electrical connections from the package and an exterior circuit and in which a semiconductor device is seated within a cavity defined by the layers and laterally disposed metal tabs rest on a shoulder surrounding the cavity to establish electrical connections between the semiconductor device and the metal filled holes of the package.

The package of the present invention lends itself to standardization and automation. It increases the availability of multi-lead packages, while reducing the fabrication and assembling costs thereof. Costly plating of external leads has been obviated. By virtue of the present invention, inprocess electrical classification and quality control testing can be achieved with standardized, interchangeable parts for replacement of defective components.

BRIEF DESCRIPTION OF THE DRAWINGS

FIG. 1 is a plan view of a packaged semiconductor device embodying the present invention with the cover of the package broken away.

FIG. 2 is a vertical section taken along line 2—2 of FIG. 1.

FIG. 3 is a plan view of the bottom layer of the package shown in FIG. 1.

FIG. 4 is an end elevation view of the bottom layer shown in FIG. 3.

DESCRIPTION OF THE PREFERRED EMBODIMENTS

Figure 5:
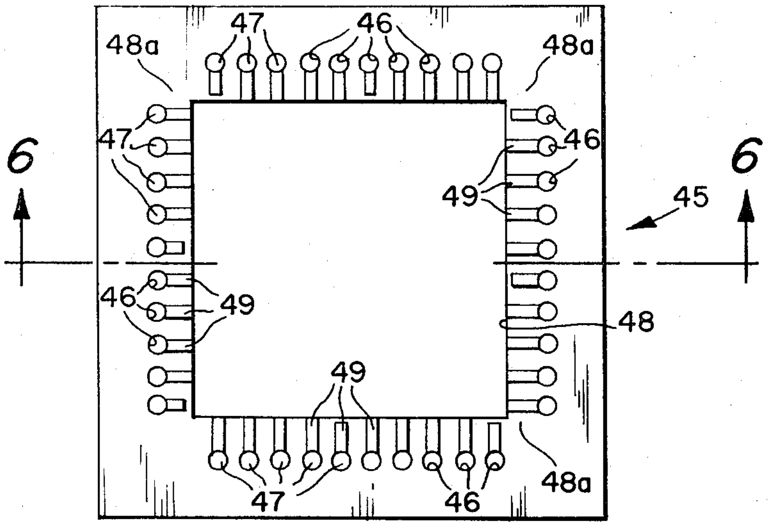
FIG. 5 is a plan view of the intermediate layer of the package shown in FIG. 1.
Figure 6:
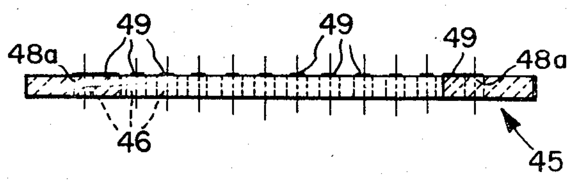
FIG. 6 is an end view of the intermediate layer shown in FIG. 5.
Figure 7:
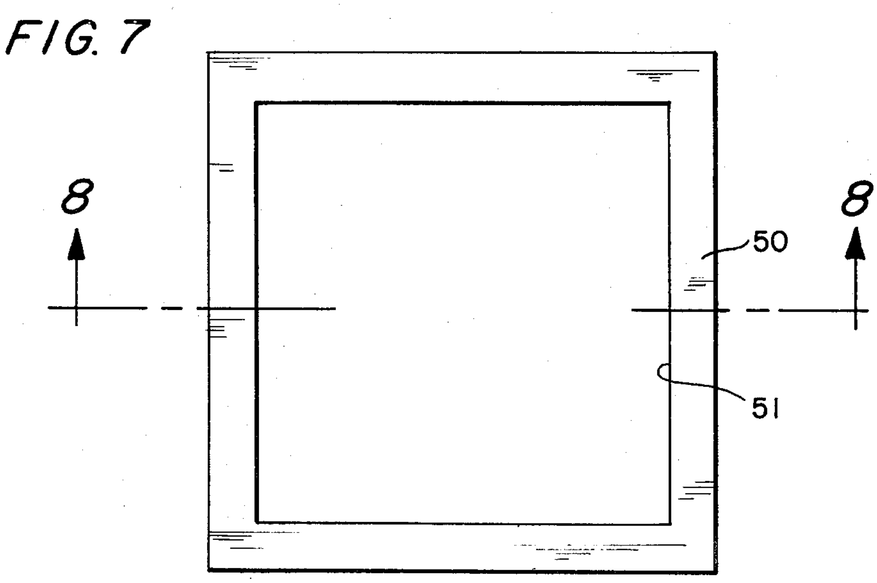
FIG. 7 is a plan view of the top layer of the package shown in FIG. 1.
Figure 8:
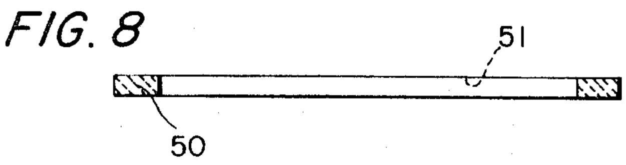
FIG. 8 is an end view of the top layer shown in FIG. 7.

Illustrated in FIGS. 1 and 2 is a package 20 for containing a suitable semiconductor device 25 and fabricated in accordance with the present invention. The package 20 comprises a ceramic base 30 and an hermetically sealed ceramic cover 35. The base 30 includes a bottom layer 40 (FIGS. 3 and 4), an intermediate layer 45 (FIGS. 5 and 6) and a top layer 50 (FIGS. 7 and 8).

As shown in FIGS. 1–4, the bottom layer 40, in its exemplary embodiment, has the same dimension on the four sides thereof and is a flat piece. Formed in the bottom layer 40 are suitable holes 41, which are vertically disposed and spaced equidistant from the adjacent edge thereof. The holes 41 are arranged to extend through the bottom layer 40. Each hole is filled with a suitable metal conductor 42, such as moly-manganese. At the lower surface of the metal filled holes are suitable conductor metal protrusions 43, such as copper, to facilitate the establishment of electrical connections from the package 20 to an external circuit, or connector, such as lead frames, flat packs, printed circuit boards, dual in-line packages and the like. Centrally disposed on the bottom layer is a suitable metal pad 44 on which is seated the suitable and conventional semiconductor device 25 terminal side up. The pad 44 preferably is made of moly-manganese, nickel and gold to assure good bonding between the ceramic bottom layer and the semiconductor device seated thereon.

On the bottom layer is disposed the intermediate layer 45 (FIGS. 1, 2, 5 and 6), which has a configuration similar to the bottom layer 40 but of greater depth. Formed in the intermediate layer 45 are suitable holes 46, which are vertically disposed and which are spaced equidistant from the adjacent edge thereof. The holes 46 are arranged to extend through the intermediate layer 45 and are arranged to be in registry with respective vertically aligned holes 41 of the bottom layer 40. Hence, the holes 46 are in register with the holes 41, respectively. Each hole 46 is filled with a suitable metal conductor 47, such as moly-manganese. The conductor metal 47 filling the holes 46 engage the metal conductor 42 filling the holes 41 for establishing respective electrical connections therebetween. It is apparent that confronting walls of the conductor metal 47 and the conductor metal 42 will have sufficient protuberances for establishing good electrical connections therebetween.

Also formed in the intermediate layer 45 is a centrally located cavity 48 of sufficient size to suitably receive a semiconductor device seated on the pad 44 of the bottom layer 40. Surrounding the cavity 48 is a shoulder or ledge 48*a*. Seated on the shoulder 48*a* are a plurality of tabs 49, which are traversely directed and extend from the conductor metal filled holes 46 to the terminals of a semiconductor device 25 through leads 49*a*. Generally, the terminals of a semiconductor device are formed with gold balls for establishing electrical connections with the semiconductor device 25. There is a lead 49*a* for each tab 49. In the exemplary embodiment, the leads 49*a* are made of gold or aluminum. Thus, the leads 49*a* establish respective electrical connections from the conductor tabs 49 to the terminals of the semiconductor device 25. In the typical embodiment, the tabs 49 are gold plated and establish respective electrical connections between the leads 49*a* and the conductor metal filled holes 46.

In another embodiment, the tabs 49 may be formed from a metal strip or ribbon which is preferably made of gold plate or may be made of nickel, iron and cobalt alloy. Should the package 20 be made of alumina oxide, then it may be desirable to use the alloy ribbon because of the thermal coefficient of expansion. The metal strip or ribbon has portions thereof selectively removed to form the tabs 49. This can be accomplished by a severing or cutting procedure. It is to be observed that each fifth tab 49 is shorter than the others to facilitate to identification of conductor leads. A suitable gold soldering process electrically connects the free ends of the leads 49*a* to the respective terminals of the semiconductor device 25 after the semiconductor device is installed in the package 20 and to the tabs 49.

Illustrated in FIGS. 1, 2, 7 and 8 is the top layer 50, which is a flat piece having a configuration conforming to the outer contour of the intermediate layer 45. Formed in the top layer is a cavity 51 of greater dimension than the cavity 48 of the intermediate layer 45, whereby the shoulder or ledge 48*a* for the tabs 49 is defined. The top layer 50 is disposed on top of the intermediate layer 45.

The layers 40, 45 and 50 are mounted as a unitary structure in a suitable jig assembly with the tabs 49 fixed to the intermediate layer 45 and are gently pressed together therein. Thus, the unitary structure is heated at a sufficient temperature to form an integrated structure. The firing or heating takes place over a period from 3 to 20 minutes at a temperature of 700° – 900° Centigrade. Should a higher grade ceramic be employed, then the temperature range would extend to 1,700° Centigrade.

After the three layers 40, 45 and 50 are fixed to form an integrated structure, the semiconductor device 25 is placed terminal side up into the integrated structure seated on the pad 44 centrally with respect to the inner walls surrounding the cavity 48. Gold solder balls establish electrical connections between the terminals on the semiconductor device 25 and the leads 49*a*, respectively, and also between the leads 49*a* and the tabs 49, respectively.

According to the present invention, a quality control testing is now performed. The semiconductor device 25 can now be tested and classified according to its electrical characteristics and capability. The package 20 can now be used as a finished product and assembled with printed circuit boards. Alternatively, the package 20 can be mounted on a conventional lead frame to be encapsulated in plastic or ceramic, or be utilized with a standard flat pack or dual-in-line package outline configuration.

In encapsulating the semiconductor device in the package 20, the cover 35 is placed on top of the top layer 50 for establishing an hermetic seal therewith. Toward this end, the assembly is retained in a sealing jig for heating from 3 to 20 minutes at a temperature of 350° – 925° Centigrade. When the package 20 has cooled to room temperature, it is removed from the sealing jig.

I claim:

1. A package for an electronic semiconductor device comprising:

a. a ceramic base with a metal pad on which the semiconductor device is seated with the terminals thereof at an elevated position;
b. first ceramic wall means on said base formed with a cavity therein for receiving the semiconductor device;
c. second ceramic wall means on said first ceramic wall means, said second ceramic wall means being formed with a cavity of greater dimension than said cavity of said first ceramic wall means, said second cermaic wall means being seated on said first ceramic wall means to form a shoulder on said first ceramic wall means;
d. metallic conductor tabs disposed on said shoulder of said first ceramic wall means, said metallic conductor tabs being directed transversely for establishing electrical connections with the terminals of the semiconductor device;
e. metallic conductors disposed perpendicularly to said transversely directed conductor tabs and extending through said first ceramic wall means and said base in contact with said conductor tabs respectively for establishing electrical connections between said conductor tabs respectively and electrical connections to said package; and
f. a cover hermetically sealed to said second ceramic wall means for encapsulating the semiconductor device within said package.

2. A package as claimed in claim 1 wherein said first ceramic wall means and said second ceramic wall means form a unitary structure.

3. A package for an electronic semiconductor device comprising:

a. a ceramic bottom layer formed with a plurality of vertically disposed holes therethrough filled with metallic conducting material, a metallic pad centrally disposed on said bottom layer on which is seated the semiconductor device with the terminals thereof elevated;
b. a ceramic intermediate layer formed with a centrally located cavity for receiving the semiconductor device and with a plurality of vertically disposed holes therethrough filled with metallic conducting material, said metallic filled holes of said intermediate layer being disposed in register with respective metallic filled holes of said bottom layer for establishing electrical connections therewith;
c. a top layer formed with a cavity of greater dimension than said cavity of said intermediate layer and disposed on said intermediate layer for defining a shoulder on said intermediate layer;
d. a plurality of transversely directed metallic conductor tabs seated on said shoulder of said intermediate layer in contact respectively with the metallic conducting material of said plurality of vertically disposed holes of said intermediate layer for establishing electrical connections therewith; and
e. said bottom layer, said intermediate layer and said top layer forming a unitary structure;
f. a cover hermetically sealed to said top layer for encapsulating the semiconductor device within said package.

* * * * *